United States Patent [19]

Dijkstra et al.

[11] Patent Number: 4,507,619
[45] Date of Patent: Mar. 26, 1985

[54] AMPLIFIER WITH SIGNAL-DEPENDENT VOLTAGE SUPPLY SOURCE

[75] Inventors: Jan Dijkstra; Engel Roza, both of Eindhoven, Netherlands

[73] Assignee: U.S. Philips Corporation, New York, N.Y.

[21] Appl. No.: 436,539

[22] Filed: Oct. 25, 1982

[30] Foreign Application Priority Data

Oct. 30, 1981 [NL] Netherlands .................. 8104914

[51] Int. Cl.³ .............................................. H03F 3/21
[52] U.S. Cl. ...................................... 330/297; 330/263
[58] Field of Search ............... 330/123, 137, 202, 267, 330/273, 297, 263

[56] References Cited

U.S. PATENT DOCUMENTS 4,054,843  10/1977  Hamada ........................ 330/297 X
4,218,660   8/1980  Carver ............................. 330/297

*Primary Examiner*—James B. Mullins
*Attorney, Agent, or Firm*—Robert T. Mayer; Bernard Franzblau

[57] ABSTRACT

In a combination of an amplifier (2,5,6) and a signal-dependent voltage supply source (16-23) coupled thereto, a portion of the signal from a signal source (1) is applied by an amplifier (9) to a comparator (16), the output signal of which controls a limiter (20-21). A portion of the output signal thereof is applied as a feedback signal to a second input of the comparator (16) by means of a low-pass filter (22) and a feedback network (23) in series. The feedback loop thus formed is arranged so that it oscillates at a comparatively high frequency. A signal-dependent modulation of the pulse width and/or the pulse density then occurs at the limiter output. A supply voltage for the amplifier is derived from the output of the filter (22). Owing to the high feedback factor of the feedback loop at the signal frequencies the supply voltage can adequately follow the output signal of the amplifier independently of component tolerances and any load variations.

18 Claims, 1 Drawing Figure

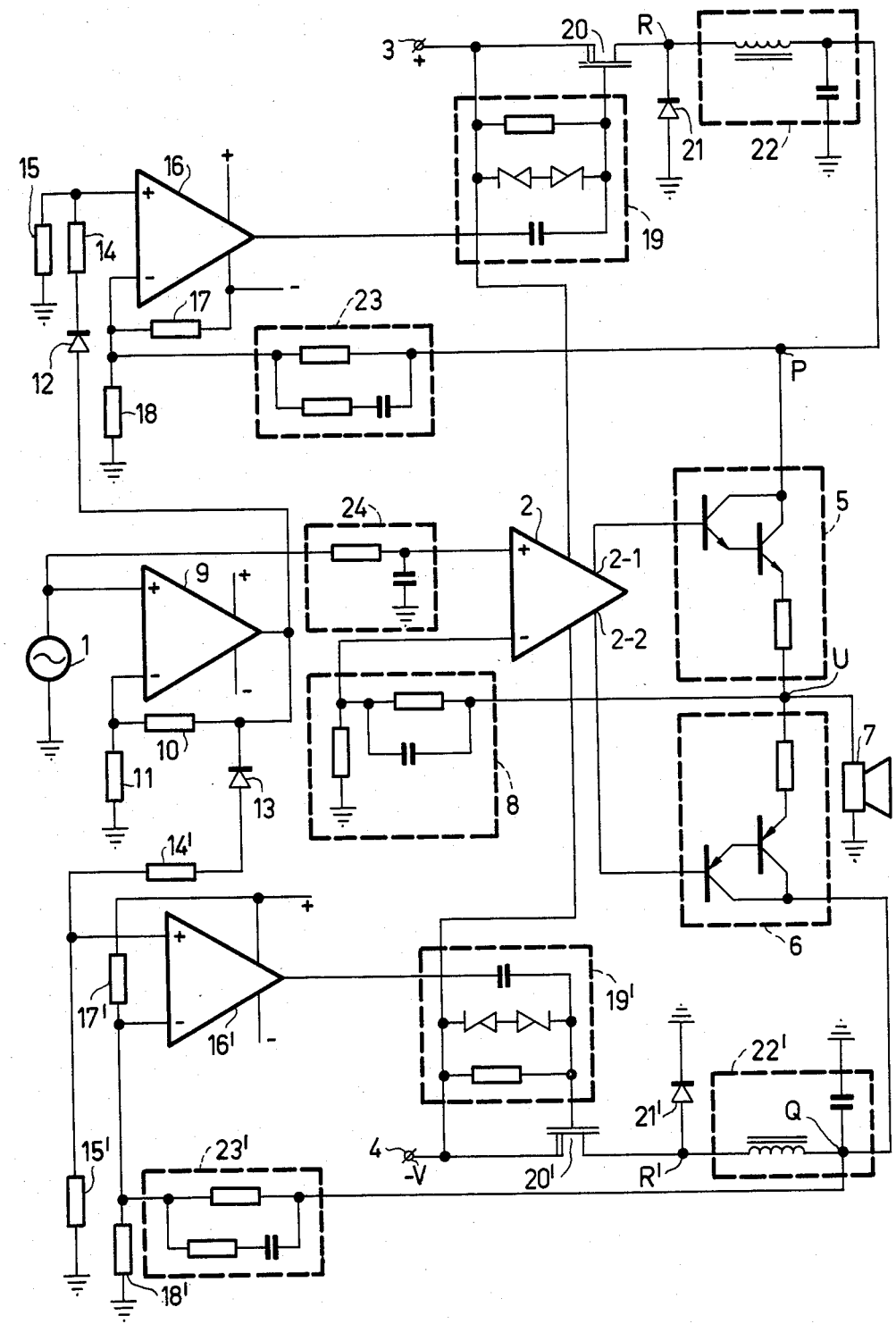

AMPLIFIER WITH SIGNAL-DEPENDENT VOLTAGE SUPPLY SOURCE

This invention relates to a combination of an amplifier and a signal-dependent supply voltage source coupled thereto, the supply voltage of the source varying in accordance with the signal which is amplified by the amplifier.

Such a combination is described in the Netherlands patent application No. 7604175 which corresponds to U.S. Pat. No. 4,054,843. To vary the supply voltage, this combination uses pulse-width modulation, it being possible to take the modualting signal from the input or from the output of the amplifier. Such a signal-dependent power supply is rather complicated owing to the use of separate oscillators and modulators for the pulse-width modulation and, in addition, is rather sensitive to component tolerances and load variations, while the required stability imposes exacting requirements on the design.

The invention has for an object to provide a combination of an amplifier and a signal-dependent supply voltage source whose supply voltage can, with a low sensitivity to tolerances and load variations, adequately follow the instantaneous value of the amplifier output voltage at a fixed difference therefrom.

According to the invention, the combination of an amplifier and a signal-dependent supply voltage source is characterized in that a portion of the said signal is applied to an input of a comparator whose output signal controls a limiter, a portion of the limiter output signal being applied as a feedback signal to a second input of the comparator through a filter and a feedback network in series, in such a manner that a high frequency oscillation is produced in the feedback loop formed by the comparator, the limiter, the filter and the feedback network, in which a signal-dependent modulation of the pulse width and/or the pulse density of the pulse-shaped output signal of the limiter occurs. A supply voltage for the output section of the amplifier is derived from the output of the said filter.

The invention will now be further described by way of example with reference to an embodiment shown in the accompanying drawing.

The signal from a signal source 1 is applied to the non-inverting input of a control amplifier 2 whose supply terminals are connected to a terminal 3 for a positive supply voltage and a terminal 4 for a negative supply voltage. The complementary outputs 2-1 and 2-2 of the control amplifier 2 control two complementary output stages 5 and 6 of a conventional construction. A load 7 is connected to the junction U of the stages 5 and 6. The other side of the load is at a reference potential (ground).

The output stages 5 and 6 are located between the points P and Q and the load 7. Supply voltages of a positive and a negative polarity, respectively are applied to the points P and Q. The output stages 5 and 6 together form a class-B amplifier and the junction U forms the output of the class-B amplifier. This output is fed back to the inverting input of control amplifier 2 through a feedback network 8.

The signal from signal source 1 is further applied to the non-inverting input of an operational amplifier 9, having an output fed back to its inverting input by way of the resistors 10 and 11. The output signal of amplifier 9 is split into a positive by diode 12 and into a negative portion by diode 13.

The positive signal portion is applied to the non-inverting input of a voltage comparator 16 by way of the resistors 14 and 15. By way of the resistors 17 and 18 a small negative bias voltage is applied to the inverting input of comparator 16. The differential input voltage of comparator 16 is therefore larger than the positive signal portion by a small fixed amount $\Delta V$.

The output signal of comparator 16 is applied to the gate of a P-channel field effect switch 20 (MOSFET) by way of a control netwrok 19. This field effect switch is connected between the terminal 3 and the point R, which in turn is connected to ground through a diode 21. The switch 20 and the diode 21 together form a limiter circuit having the point R as its output. The point R is connected either to the positive supply voltage (switch 20 conducting; diode 21 cut-off) or to ground (switch 21 non-conducting; diode 21 conducting).

A portion of the output signal of the limiter 20-21 is applied to the inverting input of comparator 16 via the series arrangement of a low-pass filter 22 and a feedback network 23.

An oscillation is produced in the feedback loop formed by the components 16, 19, 20, 21, 22 and 23 when the gain in the loop is higher than unity for signals experiencing a 180° phase shift. The loop components are chosen so that this is indeed the case at a comparatively high frequency.

The supply point P, mentioned above, of the class-B amplifier 5-6 is formed by the output of filter 22. The output signal of the filter 22 is the filtered version of the output signal of the limiter 20-21. This last-mentioned output signal is a pulse-width and/or pulse-density modulated pulse-shaped signal. The spectrum of this signal has a baseband portion which corresponds to the input signal, and further consists of double sidebands at either side of the oscillation frequency and the harmonics thereof. The low-pass filter 22 transmits the baseband signal and a portion of the higher frequency components. The degree to which these components are suppressed will depend on the ratio between the oscillation frequency of the loop and the resonant frequency of filter 22. A high oscillation frequency therefore has an advantageous effect. In one embodiment the oscillation frequency was 400 kHz and the resonant frequency of filter 22 was 40 kHz.

The voltage at the point P follows the positive portion of the output signal of amplifier 9 at a fixed difference voltage VCE therefrom, which difference voltage is proportional to the bias voltage $\Delta V$ of comparator 16.

The negative portion of the output signal of amplifier 9 is processed in the circuits shown in the lower portion of the Figure, which circuits correspond in a one-to-one relationship to the circuits shown in the upper portion of the Figure which process the positive signal portion. This correspondence is expressed in the Figure by using the same reference numerals but providing them with an accent notation. The only differences are that comparator 16' receives a small positive bias voltage at its inverting input, that the field effect transistor 20' is of the N-channel type and is connected to the terminal 4 and that the diode 21' is poled differently from diode 21. The result is that the voltage at point Q follows the negative portion of the output signal of amplifier 9 at a fixed difference voltage VCE therefrom.

The signal at the output U of the class-B amplifier 5-6 is proportional to the output signal from signal source 1. By suitable choice of components it can be achieved that the voltage at point P follows the positive portion of the signal on output U at the fixed difference voltage VCE therefrom and that the voltage on point Q follows the negative portion of the signal of output U at the fixed difference voltage VCE therefrom. This choice results in the gain to points P and Q, respectively, from the signal source 1 being equal to the gain to output U from signal source 1. A possible way of realizing this is to make the attentuation caused by the resistors 14 and 15 equal to the gain of amplifier 9 and to make the transfer ratio of the feedback network 8 for the signal frequencies equal to the transfer ratio of the feedback network 23 and the resistor 18 for the signal frequencies.

During the positive signal portion at the output U the constant voltage VCE which is determined by the value ΔV of the bias voltage of the comparator 16 is present across the output stage 5. During the negative signal portion the constant voltage VCE is present across the output stage 6. ΔV can be adjusted so that the output stage 5 or 6 carrying the output current for the load 7 receives sufficient voltage to linearly amplify the signal provided by amplifier 2.

The feedback factor of the feedback loops can be made large at the signal frequencies, as a result of which the supply voltages at the points P and Q can adequately follow the output signal of the amplifier to a large degree independently of the tolerenaces of the components and of any load variations.

A certain time delay, which becomes important at the higher signal frequencies, occurs in the supply voltage circuits and is predominatly caused by the filters 22 and 22'. To prevent signal distortion from resulting in the signal path the same time delay can be provided in the signal path. This can be realized by including two independent RC-filters. One of these RC-filters is the filter 24, which is provided in the forward signal path between signal source 1 and amplifier 2. The other RC-filter is provided in the feedback path and is formed by the feedback network 8, which for this purpose is in the form of a RC-filter.

The feedback networks 23 and 23' are in the form of networks which are commonly referred to as phase lead networks. These networks shift the frequency at which 180° phase shift occurs in the feedback loops to a higher value so that these loops will oscillate at a high to very high frequency. A high oscillation frequency relative to the highest signal frequency will result in significant suppression of the higher modulation products by the filters 22 and 22' so that the supply voltages at the points P and Q will follow the signal at the output U to the best possible extent.

What is claimed is:

1. An amplifier with a signal-dependent supply voltage source comprising, an amplifier, a signal-dependent supply-voltage source coupled thereto so that the supply voltage of said source varies in accordance with a signal amplified by the amplifier, means for applying a portion of said signal to an input of a comparator having an output signal that controls a limiter, means for applying a portion of the limiter output signal as a feedback to a second input of the comparator through a filter and a feedback network connected in series so that a high frequency oscillation is produced in a feedback loop formed by the comparator, the limiter, the filter and the feedback network, whereby a signal-dependent modulation of the pulse width and/or the pulse density of a pulse-shaped output signal of the limiter is produced, and means coupling an output section of the amplifier to an output of said filter so as to derive a supply voltage for said amplifier output section from said filter output.

2. An amplifier as claimed in claim 1, characterized in that the feedback network exhibits a phase lead characteristic.

3. An amplifier as claimed in claim 2 wherein the amplifier comprises means for producing a time delay in a signal path of the amplifier which corresponds to a time delay occuring in the supply voltage source.

4. An amplifier as claimed in claim 3 wherein said time delay producing means comprise two RC-filters, one of which is connected in a forward signal path and the other one of which is connected in feedback path of the amplifier.

5. An amplifier as claimed in claim 1 wherein the amplifier comprises means for producing a time delay in the signal path which corresponds to a time delay occuring in the supply voltage source.

6. An amplifier as claimed in claim 5, wherein said time delay producing means comprise two RC-filters, one of which is connected in a forward signal path and the other one of which is connected in a feedback path of the amplifier.

7. An amplifier as claimed in claim 1 further comprising a forward circuit providing a signal path between a signal input terminal and a signal output terminal of the amplifier, said forward circuit including a first RC filter and said amplifier output section, a feedback network for the amplifier coupled to said output terminal and comprising a second RC filter, said first and second RC filters providing a time delay related to a time delay produced by said filter in the feedback loop.

8. An amplifier as claimed in claim 1 wherein said filter comprises an LC circuit having a low pass characteristic and the components of said feedback loop provide a high frequency oscillation at a frequency above the highest expected signal frequency whereby the level of the supply voltage follows the amplifier signal level independently of load variations on the amplifier.

9. A signal amplifying apparatus comprising, a signal input terminal, a signal output terminal, a circuit including amplifier means providing a forward signal path between said input and output terminals, said amlifier means including an amplifier input stage and an amplifier output stage connected in cascade, a first feedback network coupling said output terminal to an input of the amplifier input stage, a supply voltage terminal coupled to the amplifier output stage, a feedback oscillation loop circuit for producing a high frequency oscillation at an oscillation frequency substantially higher than the signal frequency, said feedback oscillation loop circuit comprising, a comparator having an output that controls a limiter and first and second inputs, a filter and a second feedback network connected in cascade between an output of the limiter and the second input of the comparator to complete the feedback oscillation loop circuit, means for applying the signal to the first input of the comparator thereby to produce a signal-dependent pulse width modulation of a pulse-shaped output signal of the limiter, and means coupling the output of the filter to said supply voltage terminal to produce thereat a signal-dependent supply voltage.

10. Apparatus as claimed in claim 9 wherein the amplifier input stage comprises an amplifier having a first input coupled to the input terminal via a first RC filter circuit, a second input coupled to an output of the first feedback network, and an output coupled to a signal input of the amplifier output stage.

11. Apparatus as claimed in claim 10 wherein the first feedback network includes an RC circuit, said RC circuit and said first RC filter circuit having time delays in a predetermined relationship to a time delay produced by said filter in the feedback oscillation loop circuit.

12. Apparatus as claimed in claim 9 wherein the second feedback network comprises a phase lead network.

13. Apparatus as claimed in claim 9 wherein the filter in the feedback oscillation loop circuit has a resonant frequency such that said oscillation frequency is approximately ten times said resonant frequency.

14. Apparatus as claimed in claim 9 wherein the filter in the feedback oscillation loop circuit comprises a low pass LC circuit having a resonant frequency of approximately 40 KHz and said oscillation frequency is approximately 400 KHz.

15. Apparatus as claimed in claim 9 wherein at the signal frequencies the transfer ratio of the first feedback network is approximately equal to the transfer ratio of the second feedback network.

16. Apparatus as claimed in claim 9 wherein the circuit providing a forward signal path comprises an RC filter connected between said input terminal and first input of an amplifier of said amplifier input stage, said amplifier having an output coupled to a signal input of the amplifier output stage and a second input coupled to the signal output terminal via the first feedback network, and wherein the signal applying means comprises a second amplifier having a first input coupled to the signal input terminal and an output coupled to a second input thereof and to said first input of the comparator.

17. Apparatus as claimed in claim 9 wherein the limiter comprises an FET device connected in series with a diode between a source of DC voltage and a point of reference potential, the gate of said FET device being connected to the output of the comparator via a control network, and wherein the filter comprises a low pass LC circuit having an input coupled to a junction between the diode and the FET device and an output coupled to the second feedback network and to the supply voltage terminal.

18. Apparatus as claimed in claim 9 wherein said amplifier means is adapted to amplify signals in the audio frequency spectrum and said filter comprises an LC circuit having a low pass characteristic, the components of said feedback oscillation loop circuit producing an oscillation frequency that is higher than the highest audio signal frequency to be amplified.

* * * * *

UNITED STATES PATENT AND TRADEMARK OFFICE
CERTIFICATE OF CORRECTION

PATENT NO. : 4,507,619
DATED      : March 26, 1985
INVENTOR(S): DIJKSTRA, Jan ET AL It is certified that error appears in the above-identified patent and that said Letters Patent is hereby corrected as shown below:

Claim 1, line 8, after "feedback" insert --signal--

Claim 5, line 3, change "the" to --a--;
after "path" insert --of the amplifier--

Claim 9, line 4, change "amlifier" to --amplifier--

Claim 16, line 3, after "and" insert --a--

Signed and Sealed this

Ninth Day of July 1985

[SEAL]

*Attest:*

DONALD J. QUIGG

*Attesting Officer*     *Acting Commissioner of Patents and Trademarks*